(12) United States Patent
Huang et al.

(10) Patent No.: US 11,037,789 B2
(45) Date of Patent: *Jun. 15, 2021

(54) CUT LAST SELF-ALIGNED LITHO-ETCH PATTERNING

(71) Applicant: Taiwan Semiconductor Manufacturing Co., Ltd., Hsin-Chu (TW)

(72) Inventors: Kuan-Wei Huang, Taoyuan (TW); Chia-Ying Lee, New Taipei (TW); Ming-Chung Liang, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/705,536

(22) Filed: Dec. 6, 2019

(65) Prior Publication Data
US 2020/0111670 A1    Apr. 9, 2020

Related U.S. Application Data

(63) Continuation of application No. 15/696,498, filed on Sep. 6, 2017, now Pat. No. 10,553,431, which is a continuation of application No. 15/170,090, filed on Jun. 1, 2016, now Pat. No. 9,761,451, which is a continuation of application No. 14/154,454, filed on Jan. 14, 2014, now Pat. No. 9,368,349.

(51) Int. Cl.
*H01L 21/033*     (2006.01)
*H01L 27/11*      (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 27/11* (2013.01)

(58) Field of Classification Search
None
See application file for complete search history.

(56) References Cited

U.S. PATENT DOCUMENTS

| 7,611,980 | B2  | 11/2009 | Wells et al. |
| 7,871,909 | B1  | 1/2011  | Wang et al. |
| 8,026,044 | B2* | 9/2011  | Lee ............. H01L 21/0337 430/270.1 |
| 8,343,874 | B2  | 1/2013  | Watanabe |

(Continued)

OTHER PUBLICATIONS

Zimmerman. "Double patterning lithography: double the trouble or double the fun?" SPIE Newsroom published in 2009.

(Continued)

*Primary Examiner* — Roberts P Culbert
(74) *Attorney, Agent, or Firm* — Eschweiler & Potashnik, LLC

(57) ABSTRACT

The present disclosure relates to a method of performing a semiconductor fabrication process. The method may be performed by forming a spacer material over an underlying layer. The spacer material has sidewalls defining a first trench. A cut material is formed over the spacer material and within the first trench. The cut material separates the trench into a pair of trench segments having ends separated by the cut material. The underlying layer is patterned according to the spacer material and the cut material.

20 Claims, 7 Drawing Sheets

(56) References Cited

U.S. PATENT DOCUMENTS

| | | | |
|---|---|---|---|
| 8,835,323 | B1 | 9/2014 | Shieh et al. |
| 9,368,349 | B2 | 6/2016 | Huang et al. |
| 9,425,049 | B2 | 8/2016 | Huang |
| 10,553,431 | B2 * | 2/2020 | Huang ................ H01L 21/0332 |
| 2010/0155959 | A1 | 6/2010 | Park et al. |
| 2012/0094492 | A1 | 4/2012 | Park et al. |
| 2012/0302057 | A1 | 11/2012 | Arnold et al. |
| 2014/0091434 | A1 | 4/2014 | Hopkins |
| 2014/0213066 | A1 | 7/2014 | Tung |
| 2015/0072531 | A1 | 3/2015 | Tung |
| 2015/0155171 | A1 | 6/2015 | Chang |

OTHER PUBLICATIONS

Zhang, et al. "Mask Cost Reduction with Circuit Performance Consideration for Self-Aligned Double Patterning." Asia and South Pacific Design Automation Conference, published in 2011.
U.S. Appl. No. 14/154,439, filed Jan. 14, 2014.
Jo Finders ; Mircea Dusa ; Bert Vleeming ; Henry Megens ; Birgitt Hepp ; Mireille Maenhoudt ; Shaunee Cheng ; Tom Vandeweyer ; Double patterning for 32nm and below: an update. Proc. SPIE 6924, Optical Microllithography XXI, 692408 (Mar. 18, 2008).
Chris Bencher ; Yongmei Chen ; Yongmei Chen ; Huixiong Dai ; Warren Montogmery ; Lior Huli ; 22nm half-pitch patterning by CVD spacer self alignment double patterning (SADP). Proc. SPIE 6924, Optical Microlithography XXI, 69244E (Mar. 7, 2008).
Non Final Office Action dated Sep. 2, 2015 U.S. Appl. No. 14/154,439.
Notice of Allowance dated Apr. 22, 2016 U.S. Appl. No. 14/154,439.
Non-Final Office Action dated Jul. 8, 2015 for U.S. Appl. No. 14/154,454.
Final Office Action dated Nov. 9, 2015 for U.S. Appl. No. 14/154,454.
Notice of Allowance dated Feb. 16, 2016 for U.S. Appl. No. 14/154,439.
Non Final Office Action dated Nov. 3, 2016 U.S. Appl. No. 15/202,842.
Notice of Allowance dated Feb. 27, 2017 for U.S. Appl. No. 15/202,842.
Non-Final Office Action dated Dec. 13, 2016 for U.S. Appl. No. 15/170,090.
Notice of Allowance dated May 5, 2017 for U.S. Appl. No. 15/170,090.
Notice of Allowance dated Jun. 21, 2018 in connection with U.S. Appl. No. 15/633,152.
Non-Final Office Action dated Mar. 8, 2019 for U.S. Appl. No. 15/696,498.
Final Office Action dated Aug. 9, 2019 for U.S. Appl. No. 15/696,498.
Notice of Allowance dated Nov. 14, 2019 for U.S. Appl. No. 15/696,498.

* cited by examiner

CUT LAST SELF-ALIGNED LITHO-ETCH PATTERNING

REFERENCE TO RELATED APPLICATIONS

This Application is a Continuation of U.S. application Ser. No. 15/696,498, filed on Sep. 6, 2017, which is a Continuation of U.S. application Ser. No. 15/170,090, filed on Jun. 1, 2016 (now U.S. Pat. No. 9,761,451, issued on Sep. 12, 2017), which is a Continuation of U.S. application Ser. No. 14/154,454, filed on Jan. 14, 2014 (now U.S. Pat. No. 9,368,349, issued on Jun. 14, 2016). The contents of the above referenced Patent Applications are hereby incorporated by reference in their entirety.

BACKGROUND

The semiconductor industry has continually improved the speed and power of integrated circuits (ICs) by reducing the size of components (e.g., transistor devices) within the ICs. In large part, the ability to scale the size of components within an integrated chip is driven by lithographic resolution. However, in recent technology nodes tool vendors have been unable to decrease the wavelength of photolithography exposure tools (e.g., to successfully implement EUV lithography), so that developing technology nodes often have minimum feature sizes smaller than the wavelength of illumination used in the photolithography tools.

Double patterning lithography (DPL) has become one of the most promising lithography technologies for printing critical design layers (e.g., polysilicon, thin metal routing, etc.) in sub-22 nm technology nodes. However, some double patterning technologies (e.g., litho-etch, litho-etch) suffer from misalignment and overlay problems that degrade integrated chip performance. In recent years, self-aligned double patterning (SADP) has emerged as a double patterning technology that is able to avoid such misalignment and overlay errors.

DETAILED DESCRIPTION

Figure 1:
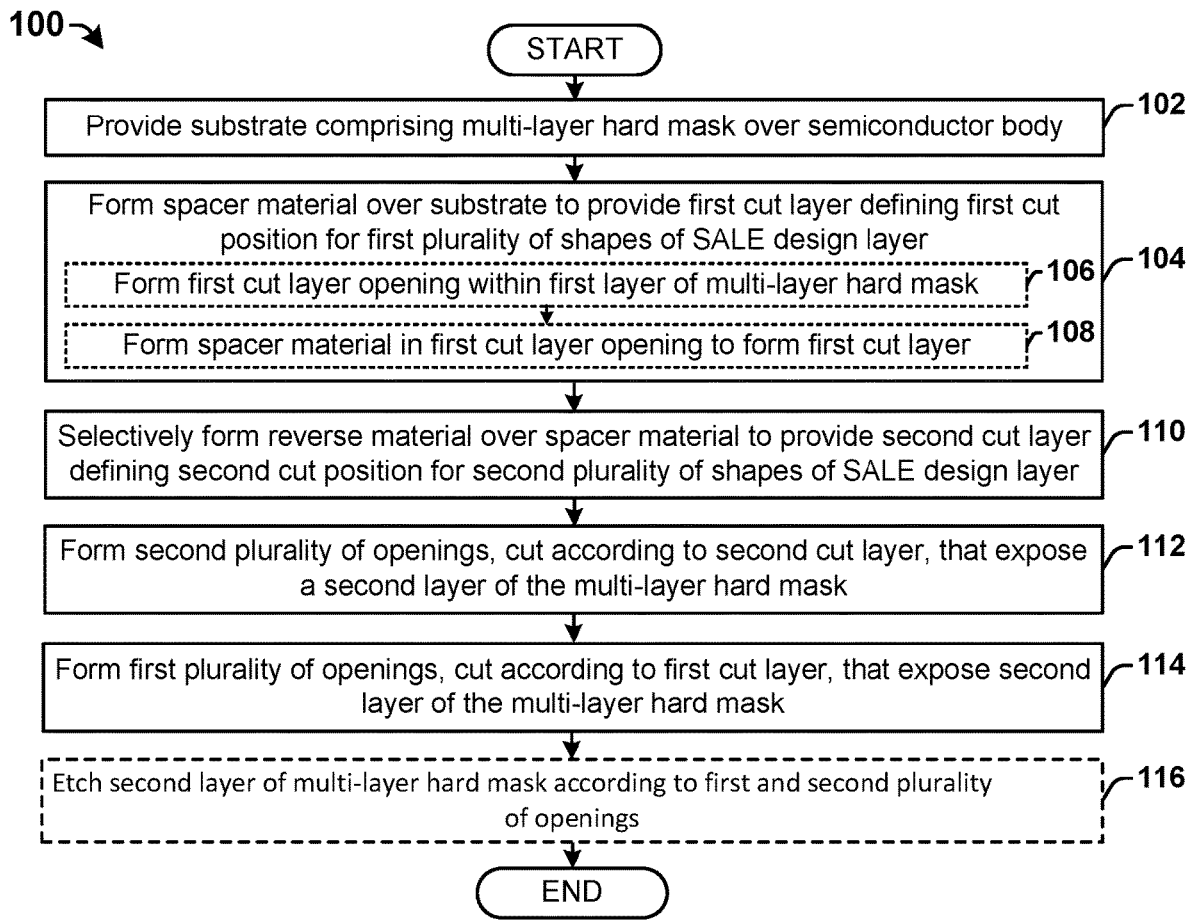
FIG. 1 illustrates some embodiments of a flow diagram of a method of performing a self-aligned litho-etch (SALE) process.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Self-aligned double patterning (SADP) technologies have been useful in forming repetitive structures such as memory arrays (e.g., SRAM memory arrays). For example, the repetitive structure of SRAM memory array bit lines and/or control lines allows for a spacer layer to be formed on sidewalls of minimum pitch openings in a patterned photoresist layer formed over a substrate during a first photolithography process. After formation of the spacer layer on the sidewalls, the patterned photoresist layer can be removed using a second photolithography process, leaving spacers separated by a space smaller than that achievable by the first photolithography process (e.g., since there are two spacers within a line). The substrate can be selectively patterned according to the spacer layer to form a dense array of lines.

A cut mask may be used to form line-end to line-end spaces in the dense array of lines. However, current SADP processes provide for end-to-end spaces between shapes formed using the second photolithography process that are larger than the end-to-end spaces between shapes formed using the first photolithography process. This is because cuts of shapes formed by the first photolithography process are performed before the shapes are lithographically formed, thereby providing for a space that can be defined by a spacer material. In contrast, cuts formed by the second photolithography process are determined by the photolithography process and therefore are limited by photo resist worse top loss profile. To further decrease the size of an IC layout, such as an SRAM cell, the end-to-end space achieved by the second photolithography process should be reduced.

Accordingly, some aspects of the present disclosure provide for a method of performing a self-aligned litho-etch process that provides for comparable end-to-end spaces between shapes formed by different photolithography processes. In some embodiments, the method is performed by providing a substrate having a multi-layer hard mask with a first layer and an underlying second layer. A spacer material is formed over the substrate to provide a first cut layer comprising the spacer material at a first cut position, and a reverse material is formed over the spacer material to form a second cut layer comprising the reverse material at a second cut position over the substrate. A second plurality of openings, cut according to the second cut layer, are formed to expose the second layer at a second plurality of positions corresponding to a second plurality of shapes of a SALE design layer. A first plurality of openings, cut according to the first cut layer, are formed to expose the second layer at a first plurality of positions corresponding to a first plurality of shapes of the SALE design layer. The second layer is then etched according to the first and second plurality of openings. By forming the first and second cut layers prior to performing photolithography processes that form the first and second plurality of openings, the end-to-end spaces of the first and second plurality of shapes can be reduced since the end-to-end spaces are not limited by photolithography resolution.

FIG. 1 illustrates some embodiments of a flow diagram of a method 100 of performing a self-aligned litho-etch (SALE) process. The method 100 comprises a cut last method since it increases a line-end space defined by a second cut layer formed after forming openings in a multi-layer hard mask corresponding to a second plurality of shapes of a SALE design layer.

At 102, a substrate is provided. In some embodiments, the substrate may comprise one or more dielectric layers disposed over a semiconductor body. In some embodiments, the substrate further comprises a multi-layer hard mask disposed over the one or more dielectric layers. The multi-layer hard mask may comprise a first layer and an underlying second layer.

At 104, a spacer material is formed over the substrate to provide a first cut layer for a first plurality of shapes of a self aligned litho-etch (SALE) design layer formed using a first photolithography process. The first cut layer is configured to define spaces, or 'cuts', in the first plurality of shapes along a line-end, so as to form an end-to-end space between lines of the first plurality of shapes. In some embodiments, the first cut layer is formed by forming a first cut layer opening within a first layer (e.g., an upper-layer) of the multi-layer hard mask, at 106. A spacer material is then formed within the first cut layer opening to form the first cut layer, at 108.

At 110, a reverse material is selectively formed over the spacer material to provide a second cut layer for a second plurality of shapes of the SALE design layer formed using a second photolithography process. The second cut layer is configured to 'cut' the second plurality of shapes along a line end to form an end-to-end space between lines defined by the second plurality of shapes. In some embodiments, the second plurality of shapes may be formed at locations disposed between the first plurality of shapes.

At 112, a second plurality of openings, which are cut according to the second cut layer, are formed to expose the second layer of the multi-layer hard mask. The second plurality of openings correspond to the second plurality of shapes of the SALE design layer. In some embodiments, the second plurality of openings may be formed by selectively opening the spacer material to expose the second layer of the multi-layer hard mask.

At 114, a first plurality of openings, which are cut according to the first cut layer, are formed to expose the second layer of the multi-layer hard mask. The first plurality of openings correspond to the first plurality of shapes of the SALE design layer. In some embodiments, the first plurality of openings may be formed by selectively etching the second layer of the multi-layer hard mask at a location intersecting the first cut layer.

At 116, the second layer of multi-layer hard mask is etched according to first and second plurality of openings. In some embodiments, one or more of the dielectric layers of the substrate may be subsequently etched according to the second layer of the multi-layer hard mask.

Thus, by forming the first and second cut layers prior to performing photolithography processes that form the first and second plurality of openings, method 100 provides for end-to-end spaces of the first and second plurality of shapes that are not limited by photolithography resolution.

Figure 2:
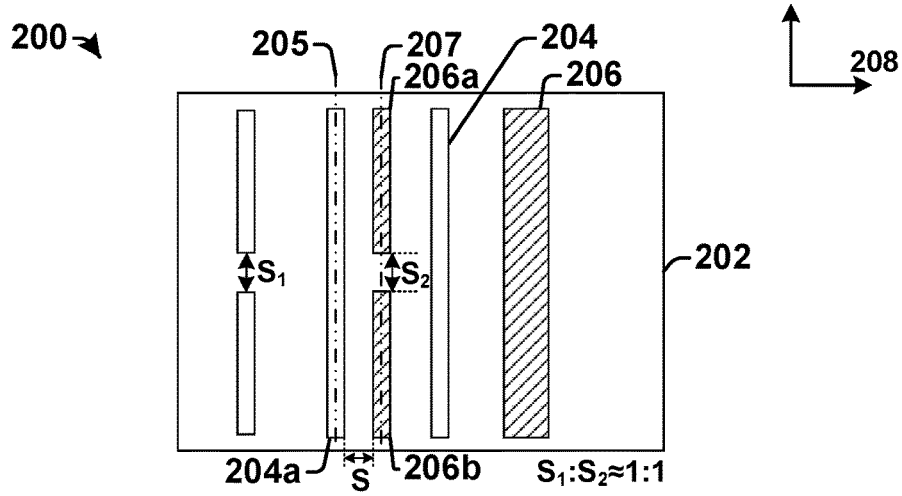
FIG. 2 illustrates some embodiments of an integrated chip formed according to the method of performing a self-aligned litho-etch process.

FIG. 2 illustrates some embodiments of an integrated chip 200 formed according to the disclosed method of performing a self-aligned litho-etch process.

The integrated chip 200 comprises a first plurality of shapes 204 and a second plurality of shapes 206 disposed on an integrated chip die 202. The first plurality of shapes 204 and the second plurality of shapes 206 are comprised within a SALE design layer (i.e., a design layer formed using a SALE lithography process). In some embodiments, the first plurality of shapes 204 may be formed using a first photolithography process of a SALE process, while the second plurality of shapes 206 may be formed using a second photolithography process of the SALE process. In some embodiments, the SALE design layer may comprise a gate layer or a back-end-of-the-line thin metal layer, for example.

Shapes from the first plurality of shapes 204 and the second plurality of shapes 206 may be separated in a first direction 208 by a space S that is less than a minimum space achievable using a single photomask (i.e., a GO-space). For example, in integrated chip 200 a shape 204a of the first plurality of shapes is located along a first line 205 extending in a second direction 210 and adjacent shapes, 206a and 206b, of the second plurality of shapes 206 are located along a second line 207 extending in the second direction 210. Shapes 206a and 206b are separated from shape 204a in the first direction 208 by a space S less than a GO-space.

Two or more of the first plurality of shapes 204 aligned in the second direction 210 are disposed in a pattern having a first end-to-end space of $S_1$. Two or more of the second plurality of shapes 206 aligned in the second direction 210 are disposed in a pattern having a second end-to-end space of $S_2$. The ratio of the first and second end-to-end spaces $S_1:S_2$ is approximately equal to 1:1.

In some embodiments, integrated chip 200 may comprise an SRAM (static-random access memory) array, wherein the first plurality of shapes 204 and the second plurality of shapes 206 comprise a plurality of bit lines. In other embodiments, integrated chip 200 may comprise an SRAM (static-random access memory) array, wherein the first plurality of shapes 204 and the second plurality of shapes 206 comprise a plurality of control lines. In yet other embodiments, integrated chip 200 may comprise a back-end-of-the-line routing section or a transistor gate section.

Figure 3:
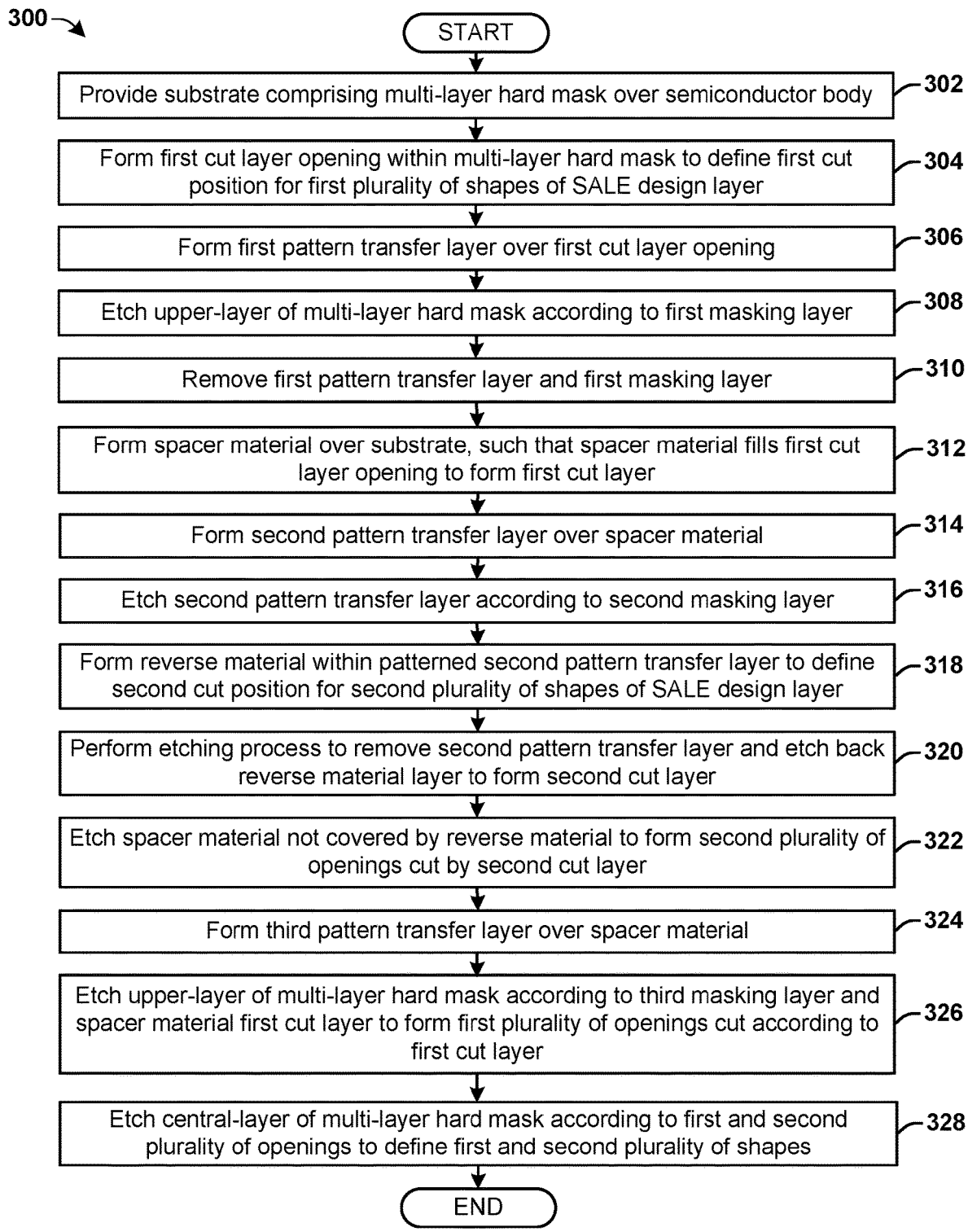
FIG. 3 illustrates some embodiments of a flow diagram of a method of performing a self-aligned litho-etch process.

FIG. 3 illustrates some embodiments of a flow diagram of a method 300 of performing a self-aligned litho-etch process.

While the disclosed methods (e.g., methods 100 and/or 300) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a substrate comprising a multi-layer hard mask overlying a semiconductor body is provided. In some embodiments, the multi-layer hard mask comprises a tri-layer hard mask having an upper-layer, a central-layer, and a lower-layer.

At 304, a first cut layer opening is selectively formed within the multi-layer hard mask to define a first cut position for a first plurality of shapes of a SALE design layer formed using a first photolithography process of a SALE process. The first cut layer opening defines a position of a first cut layer configured to cut one or more of the first plurality of shapes along a line end to form an end-to-end space between lines defined by the first plurality of shapes. In some embodiments, the first cut layer may comprise an opening in the upper-layer of the multi-layer hard mask. In some embodiments, the SALE design layer may be comprised an SRAM (static random access memory) array.

At 306, a first pattern transfer layer is formed over the first cut layer opening.

At 308, the upper-layer of the multi-layer hard mask is selectively etched according to a first masking layer disposed over the first pattern transfer layer. In some embodiments, the first masking layer may comprise a first patterned photoresist layer. In some embodiments, the upper-layer of the multi-layer hard mask is selectively etched according to the first masking layer and the first cut layer via the first pattern transfer layer.

At 310, the first pattern transfer layer and the first masking layer are removed.

At 312, a spacer material is formed over the substrate, so that the spacer material fills the first cut layer opening in the multi-layer hard mask to form a first cut layer.

At 314, a second pattern transfer layer is formed over the spacer material.

At 316, the second pattern transfer layer is selectively etched according to a second masking layer overlying the second pattern transfer layer to form an opening in the second pattern transfer layer. In some embodiments, the second masking layer may comprise a second patterned photoresist layer.

At 318, a reverse material is selectively formed within the opening in the second pattern transfer layer to define a position of a second cut position for a second plurality of shapes of the SALE design layer formed using a second photolithography process.

At 320, an etching process is performed to remove the second pattern transfer layer and to etch back the reverse material layer. Etching back the reverse material forms a second cut layer that defines a second cut position for the second plurality of shapes of the SALE design layer. The second cut layer is configured to cut one or more of the second plurality of shapes along a line end to form an end-to-end space between lines defined by the second plurality of shapes.

At 322, the spacer material not covered by the reverse material is etched to form a second plurality of openings cut by the second cut layer, which expose the central-layer of the multi-layer hard mask. The second plurality of openings correspond to the second plurality of shapes of the SALE design layer. Etching the spacer material not covered by the reverse material causes the spacer material on horizontal surfaces to be removed, resulting in spacer material being disposed onto the sidewalls of the etched multi-layer hard mask. The spacer material covered by the reverse material is not etched, leaving the second cut layer.

At 324, a third pattern transfer layer is formed over the spacer material.

At 326, the upper-layer of the multi-layer hard mask is selectively etched according to a third masking layer and the spacer material comprising the first cut layer to form a first plurality of openings cut by the first cut layer, which expose the central-layer of the multi-layer hard mask. The first plurality of openings correspond to the first plurality of shapes of the SALE design layer. In some embodiments, the third masking layer may comprise a third patterned photoresist layer. In some embodiments, an upper-layer of the multi-layer hard mask is selectively etched according to the third masking layer and the first cut layer via the third pattern transfer layer.

At 328, the central-layer of the multi-layer hard mask is selectively etched according to the first and second plurality of openings. Etching the central-layer according to the first plurality of openings defines the first plurality of shapes cut according to the first cut layer, while etching the central-layer according to the second plurality of openings defines the second plurality of shapes cut according to the second cut layer.

In some embodiments, the lower-layer of the multi-layer hard mask may be selectively etched according to the central-layer of the multi-layer hard mask, and the underlying substrate (e.g., one or more dielectric layers) may be subsequently etched according to the lower-layer (e.g., to form openings for a thin metal layer).

FIGS. 4-14 show some embodiments of substrates that illustrate the method 300 of performing a self-aligned litho-etch process. It will be appreciated that although FIGS. 4-14 are described with respect to method 300, the illustrations are not limited to method 300.

Figure 4:
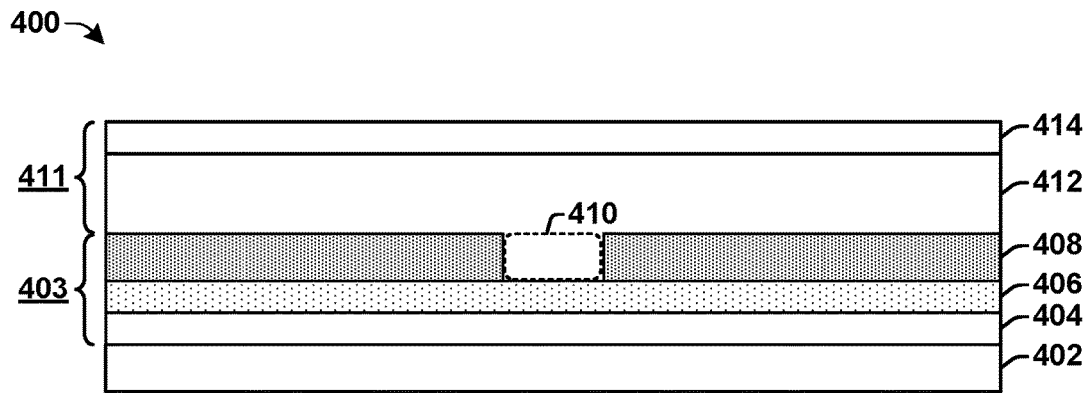
FIGS. 4-14 illustrate some embodiments of exemplary substrates showing a method of performing a self-aligned litho-etch process.

FIG. 4 illustrates some embodiments of a cross-sectional view 400 of a substrate corresponding to acts 302-306.

As shown in cross-sectional view 400, a tri-layer hard mask 403 is disposed over a semiconductor body 402. The tri-layer hard mask 403 comprises a lower-layer 404, a central-layer 406, and an upper-layer 408. In some embodiments, the lower-layer 404 comprises a titanium nitride (TiN) layer disposed over the semiconductor body 402. In some embodiments, the central-layer 406 comprises a TEOS layer disposed over the TiN layer. In some embodiments, the upper-layer 408 comprises a silicon layer disposed over the TEOS layer.

A first cut layer opening 410 is selectively formed within the multi-layer hard mask 403 to define a first cut position for a first plurality of shapes of a SALE design layer formed using a first photolithography process of a SALE lithography process. In some embodiments, the first cut layer opening 410 is formed by selectively etching the upper-layer 408 of the tri-layer hard mask 403 to form an opening that exposes the underlying central-layer 406.

A first pattern transfer layer 411 is formed over the first cut layer opening 410. In some embodiments, the first pattern transfer layer 411 may comprise a bottom layer 412 formed over the first cut layer opening 410 and a middle layer 414 formed over the bottom layer 412. In some embodiments, the bottom layer 412 may comprise a carbon layer or a hydrogen layer deposited using a vapor deposition technique or a spin-on technique. In some embodiments, the middle layer 414 may comprise a silicon oxide layer.

Figure 5:
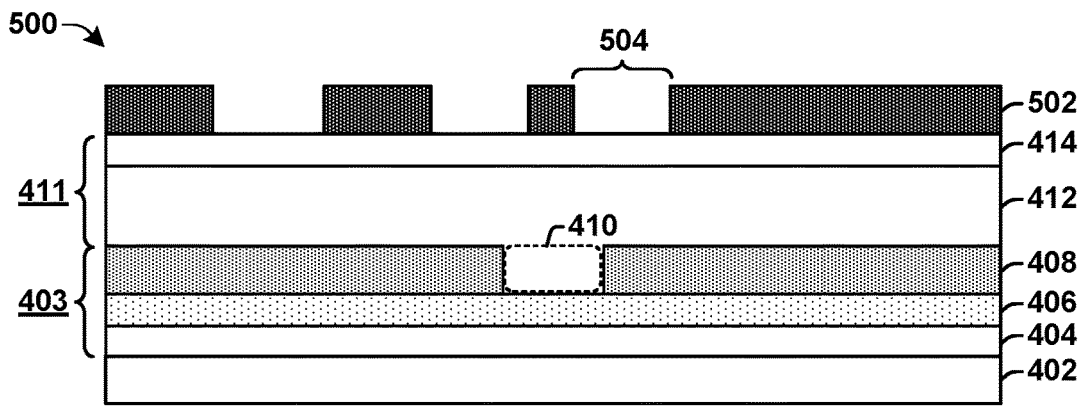

FIG. 5 illustrates some embodiments of a cross-sectional view 500 of a substrate corresponding to act 308.

As shown in cross-sectional view 500, a first patterned photoresist layer 502 is formed at a position over the first pattern transfer layer 411. In some embodiments, the first patterned photoresist layer 502 may be deposited by way of a spin-coating process and subsequently patterned by way of a photolithography process. The photolithography process selectively exposes the first patterned photoresist layer 502 to radiation having a pattern corresponding to a photomask. Selective areas of the first patterned photoresist layer 502 are subsequently removed by a developer to form the openings 504.

Figure 6:
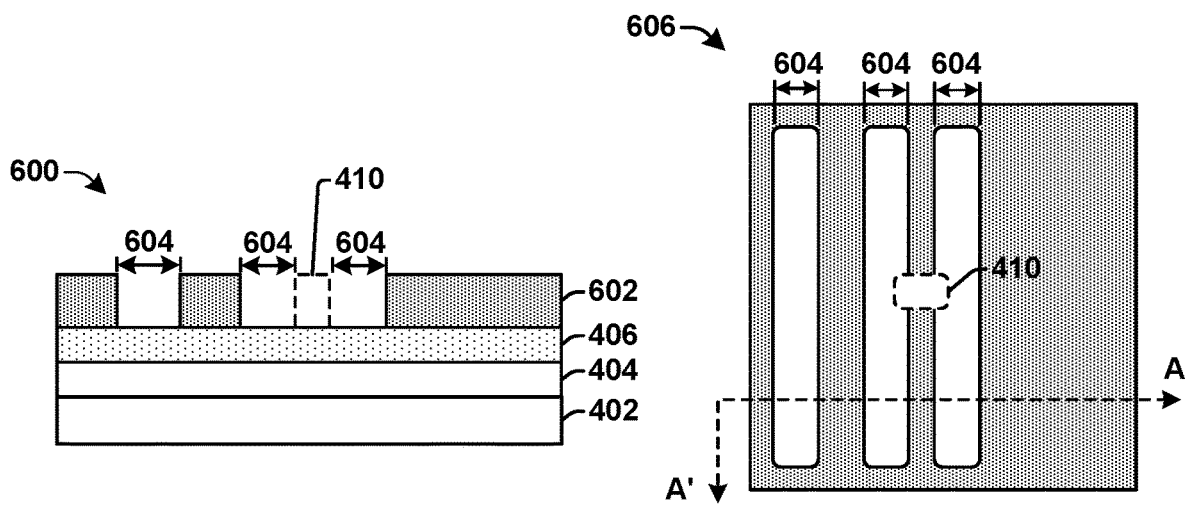

FIG. 6 illustrates some embodiments of a cross-sectional view 600 (along cross-sectional line A-A') and a corresponding top-view 606 of a substrate corresponding to acts 308-310.

As shown in cross-sectional view 600, etching the upper-layer 602 of the tri-layer hard mask 403 according to the first patterned photoresist layer 502 removes portions of the upper-layer 602 of the tri-layer hard mask 403 to form openings 604 that expose the underlying central-layer 406. Since the first cut layer opening 410 comprises an opening in the upper-layer 602, the central-layer 406 of the tri-layer hard mask 403 is exposed in the area of first cut layer opening 410.

As shown in top-view 606, the openings 604 formed by etching the upper-layer 602 of the tri-layer hard mask 403 according to the first patterned photoresist layer 502 intersect the first cut layer opening 410 to form an 'H' shaped opening in the upper-layer 602 of the tri-layer hard mask 403.

Figure 7:
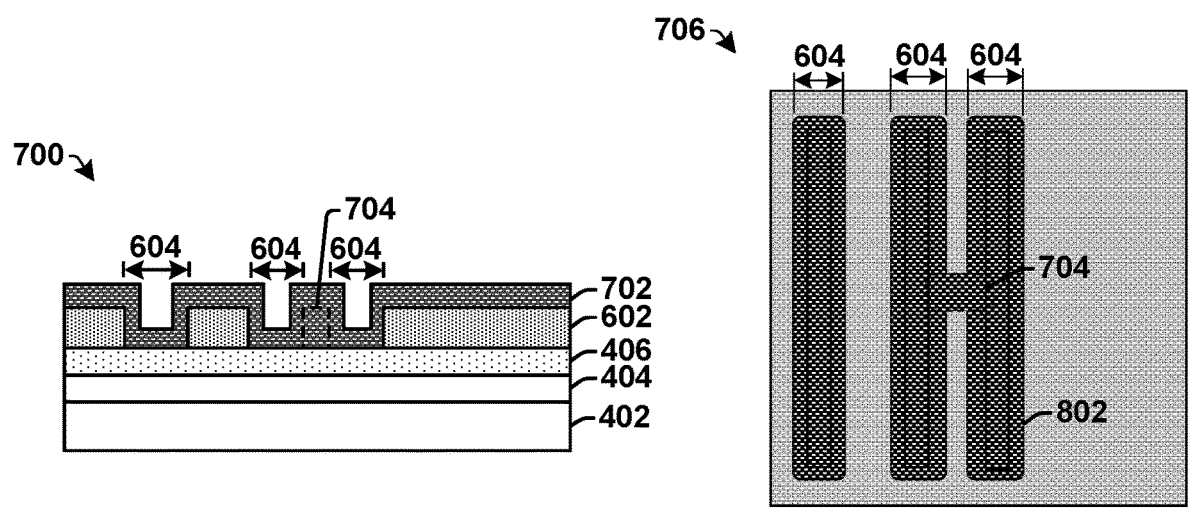

FIG. 7 illustrates some embodiments of a cross-sectional view 700 and a corresponding top-view 706 of a substrate corresponding to act 312.

As shown in cross-sectional view 700 and top-view 706, a spacer material 702 is formed over the substrate as a blanket deposition, so that the spacer material 702 is deposited onto the sidewalls and bottom surfaces of the etched upper-layer 602 of the tri-layer hard mask 403. The spacer material 702 fills the first cut layer opening 410 in the multi-layer hard mask 403 to form a first cut layer 704. In some embodiments, the spacer material 702 may comprise silicon oxide, silicon nitride, titanium oxide, or aluminum oxide. In some embodiments, the spacer material 702 may be deposited by way of a vapor deposition technique (e.g., chemical vapor deposition, physical vapor deposition, etc.).

Figure 8:
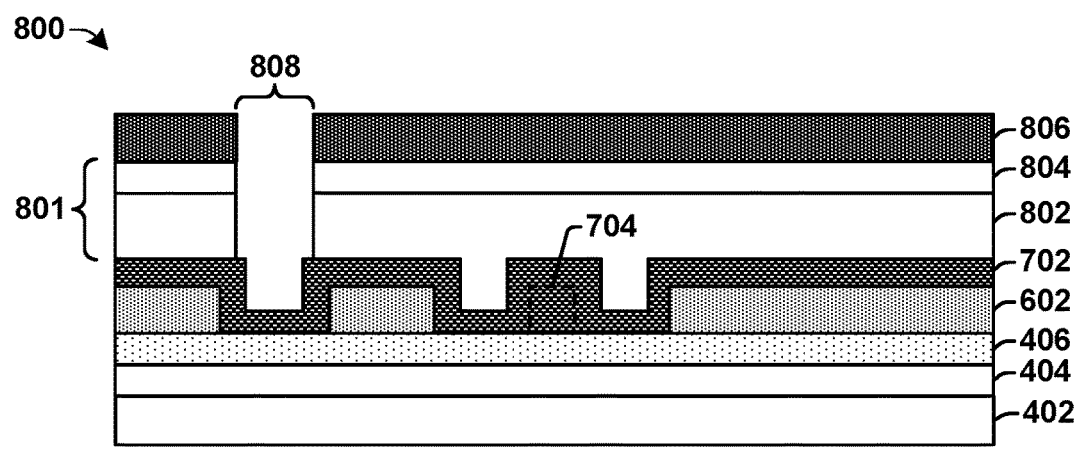

FIG. 8 illustrates some embodiments of a cross-sectional view 800 of a substrate corresponding to acts 314-316.

As shown in cross-sectional view 800, a second pattern transfer layer 801 is formed over the spacer material 702. In some embodiments, the second pattern transfer layer 801 comprises a bottom layer 802 deposited over the spacer material 702 and a middle layer 804 deposited over the bottom layer 802. A second patterned photoresist layer 806 is formed over the second pattern transfer layer 801. The second patterned photoresist layer 806 comprises one or more openings that define position of a second cut position for a second plurality of shapes of the SALE design layer for using a second SALE lithography process. The second pattern transfer layer 801 is selectively etched according to the second patterned photoresist layer 806 to form an opening 808 that extends from a top surface of the second pattern transfer layer 801 to the spacer material 702.

Figure 9:
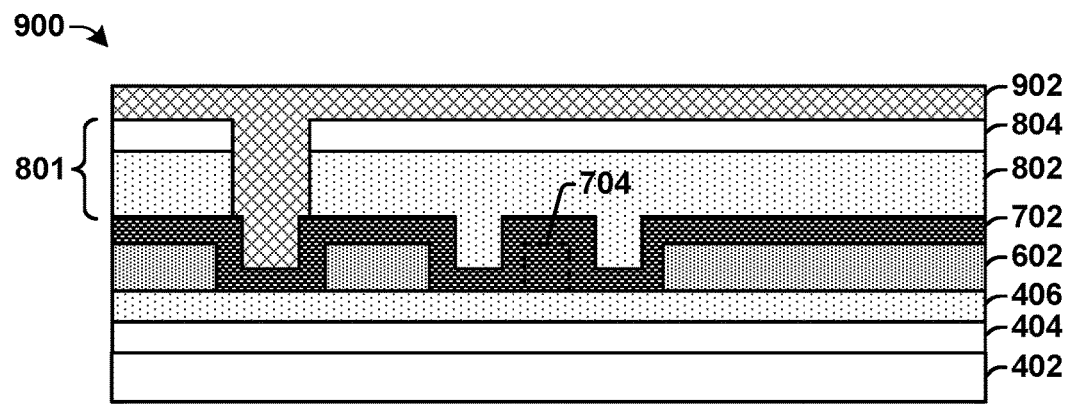

FIG. 9 illustrates some embodiments of a cross-sectional view 900 of a substrate corresponding to act 318.

As shown in cross-sectional view 900, a reverse material 902 is subsequently formed within opening 808. The reverse material 902 extends from a top of the second pattern transfer layer 801 to the spacer material 702. In some embodiments, the reverse material 902 may comprise an oxide. In other embodiments, the reverse material 902 may comprise a nitride. In yet other embodiments, the reverse material 902 may comprise silicon and have an etching selectivity of greater than 6 with respect to the spacer material. For example, the reverse material 902 may comprise silicon and have an etching selectivity of greater than 6 with respect to a titanium oxide (TiO) and a titanium nitride (TiN) spacer material.

Figure 10:
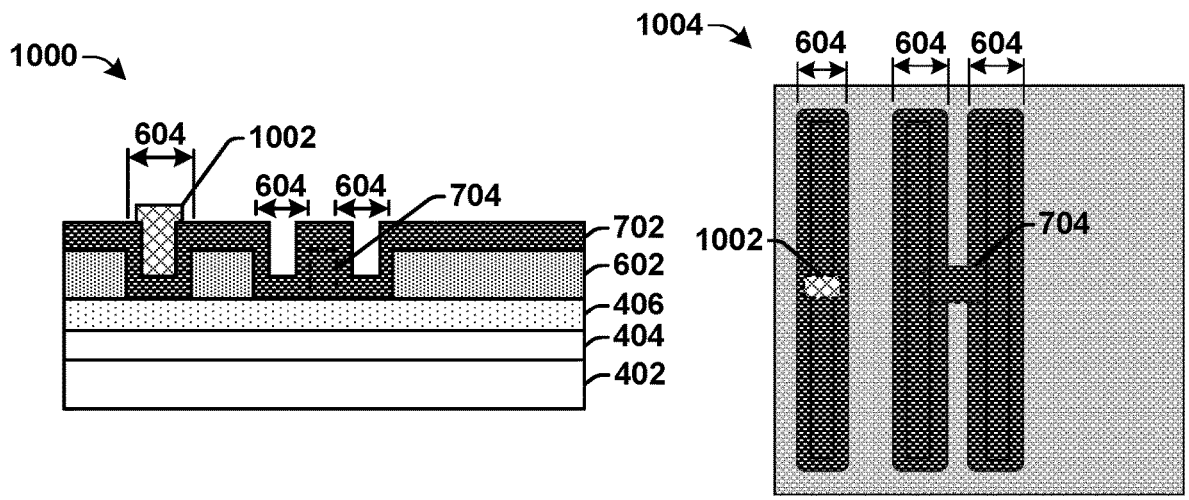

FIG. 10 illustrates some embodiments of a cross-sectional view 1000 and a corresponding top-view 1004 of a substrate corresponding to act 320.

As shown in cross-sectional view 1000, an etching process is performed to remove the second pattern transfer layer 801. The reverse material (e.g., 902 of FIG. 9) is also etched back to a leave a residue of reverse material layer that defines a second cut layer 1002 of the second plurality of shapes of the SALE design layer.

Figure 11:
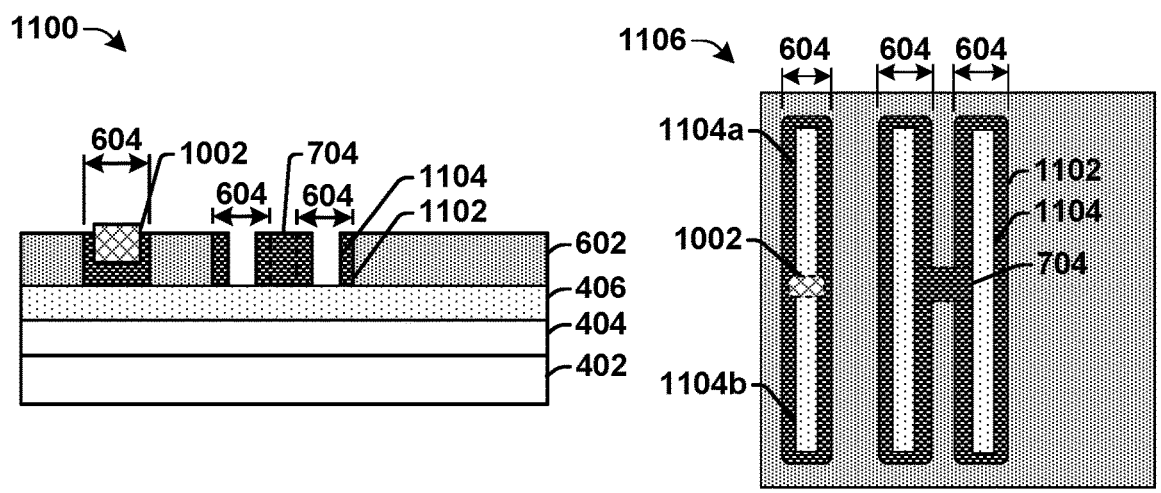

FIG. 11 illustrates some embodiments of a cross-sectional view 1100 and a corresponding top-view 1106 of a substrate corresponding to act 322.

As shown in cross-sectional view 1100, spacer material (e.g., 702 of FIG. 10) not covered by the second cut layer 1002 is etched. The remaining spacer material 1102 not covered by the second cut layer 1002 (i.e., reverse material) remains on sidewalls of the etched upper-layer 602 of the multi-layer hard mask 403 leaving a second plurality of openings 1104 that are cut by the second cut layer 1002, and which expose the underlying central-layer 406 of the multi-layer hard mask 403. The remaining spacer material 1102 covered by the second cut layer 1002 is not etched leaving the second cut layer 1002 over the central-layer 406 of the tri-layer hard mask 403.

As shown in top-view 1106, etching the spacer material 1102 forms the second plurality of openings 1104, which expose the central-layer 406 of the tri-layer hard mask 403, to have a smaller width than openings 604 in the upper-layer 602. The second cut layer 1002 extends between openings 1104a and 1104b.

Figure 12:
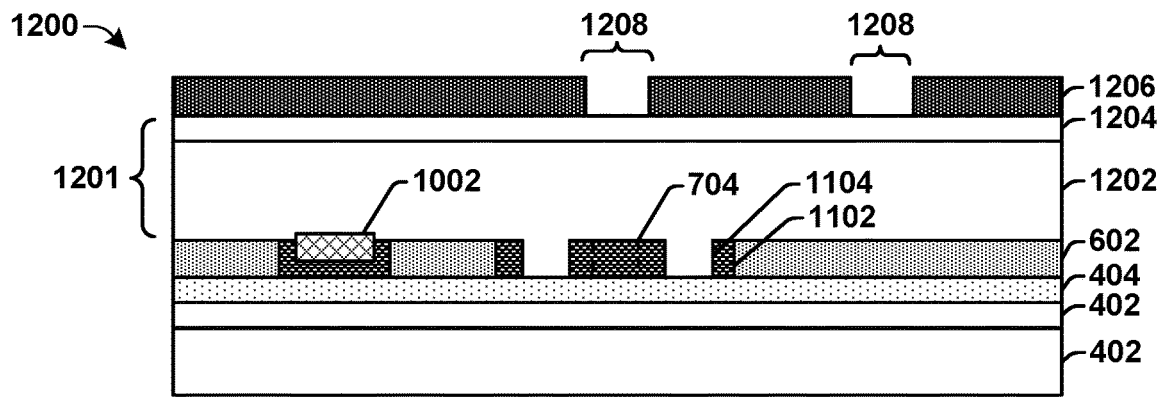

FIG. 12 illustrates some embodiments of a cross-sectional view 1200 of a substrate corresponding to act 324.

As shown in cross-sectional view 1200, a third pattern transfer layer 1201 is formed over the spacer material 1102. In some embodiments, the third pattern transfer layer 1201 comprises a bottom layer 1202 deposited over the spacer material 1102 and a middle layer 1204 deposited over the bottom layer 1202. A third patterned photoresist layer 1206 is formed over the third pattern transfer layer 1201. The third patterned photoresist layer 1206 comprises openings 1208 that correspond to locations of the first plurality of shapes of the SALE design layer.

Figure 13:
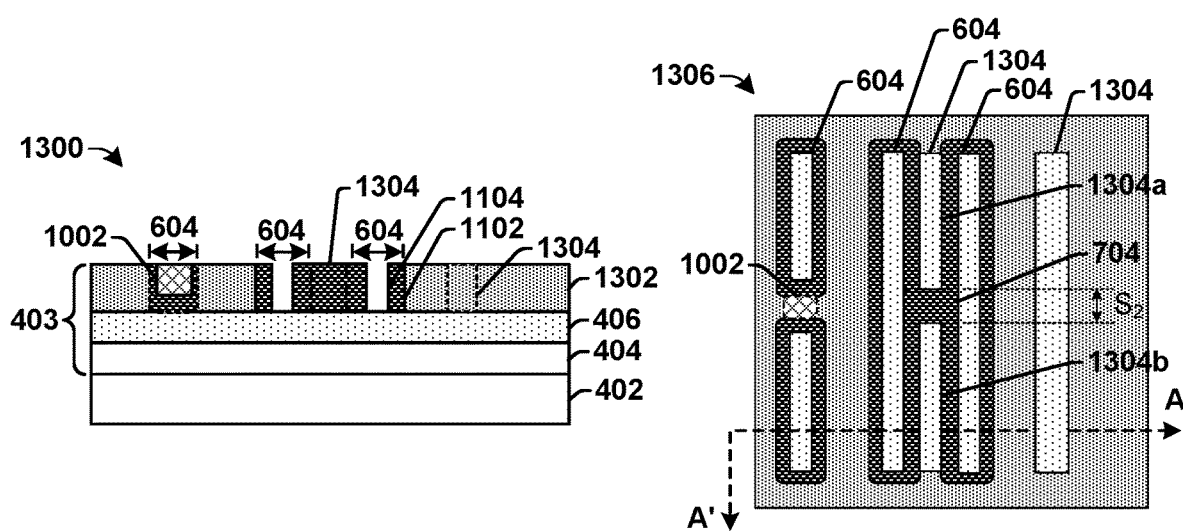

FIG. 13 illustrates some embodiments of a cross-sectional view 1300 and a corresponding top-view 1306 of a substrate corresponding to act 326.

As shown in cross-sectional view 1300, the upper-layer 1302 of the tri-layer hard mask 403 is selectively etched according to the third patterned photoresist layer (e.g., 1206 of FIG. 12) and the spacer material 1102 comprising the first cut layer 704. Etching the upper-layer 1302 of the tri-layer hard mask 403 forms a first plurality of openings 1304 that are cut by the first cut layer 704, and which expose the underlying central-layer 406. As shown in top-view 1306, the first cut layer 704 forms an end-to-end space $S_2$ between openings 1304a and 1304b.

Figure 14:
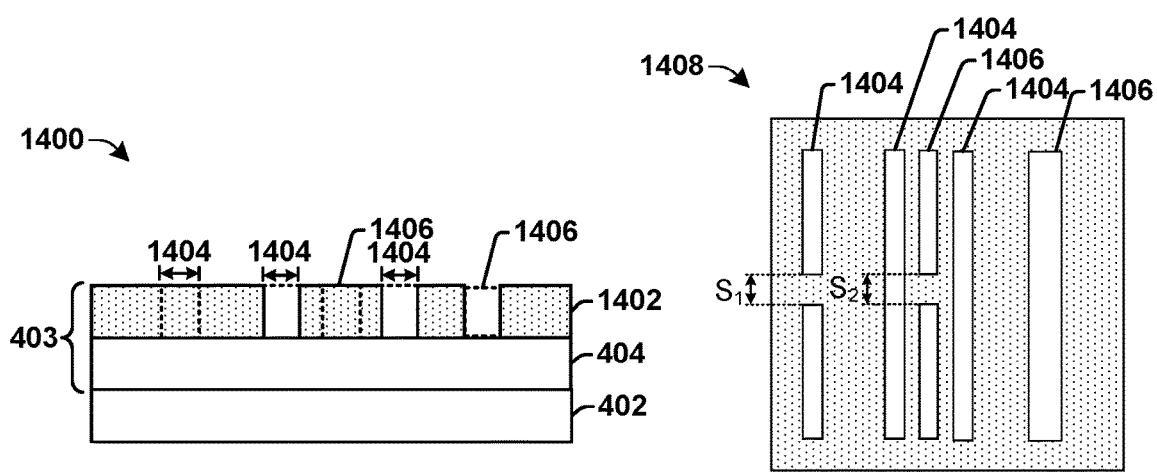

FIG. 14 illustrates some embodiments of a cross-sectional view 1400 and a corresponding top-view 1408 of a substrate corresponding to act 326.

As shown in cross-sectional view 1400 the central-layer 1402 of the tri-layer hard mask 403 is selectively etched according to the second plurality of openings 1104 and the first plurality of openings 1304 to respectively form openings 1404 and 1406 in the central-layer 1402, which correspond to the first plurality of shapes and the second plurality of shapes of the SALE design layer.

Figure 15:
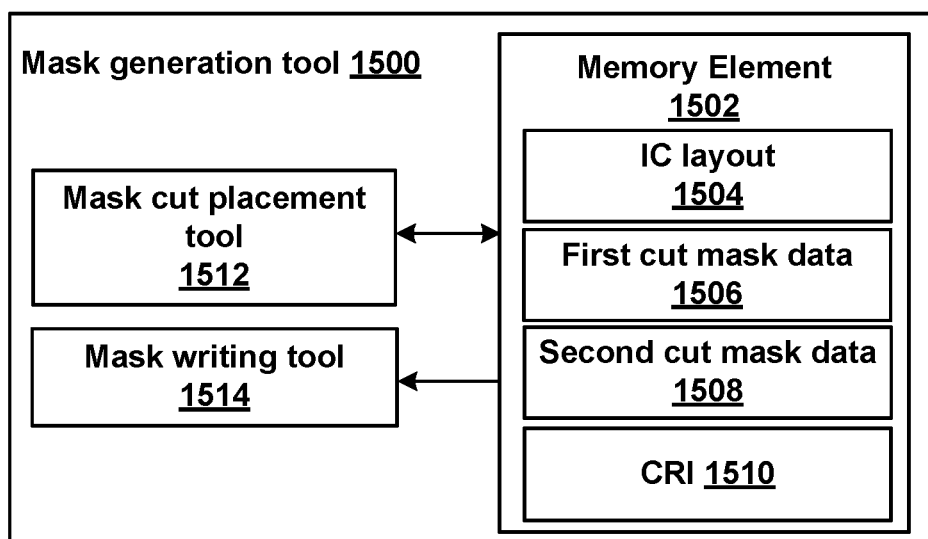
FIG. 15 illustrates a block diagram of some embodiments of a mask generation tool configured to perform self-aligned a litho-etch process.

FIG. 15 illustrates some embodiments of a mask generation tool 1500 configured to generate a reusable cut mask or trim mask.

The mask generation tool 1500 comprises a memory element 1502. In various embodiments, the memory element 1502 may comprise an internal memory or a computer readable medium. The memory element 1502 is configured to store an integrated chip (IC) layout 1504 comprising a graphical representation of an integrated chip. The IC layout 1504 comprises a first plurality of shapes of a self-aligned litho-etch (SALE) design layer formed using a first SALE lithography process and a second plurality of shapes of the design layer formed using a second SALE lithography process. In some embodiments, the SALE design layer may comprise a design layer within a static random access memory (SRAM) cell. In some embodiments, the IC layout 1504 may comprise a GDS or GDSII file, a CIF file, an OASIS file, or other similar file formats.

The memory element 1502 is further configured to store first cut layer data 1506 and second cut layer data 1508. The first cut layer data 1506 defines a first cut position for the first plurality of shapes of the SALE design layer. The second cut layer data 1508 defines a second cut position for the second plurality of shapes of the SALE design layer. In some embodiments, the memory element 1502 is further configured to store computer readable instructions 1510. The computer readable instructions 1510 may provide for a method of operating one or more components of the mask generation tool according to a disclosed method (e.g., method 100 or 300).

A mask cut placement tool 1512 is configured to access the IC layout 1504 and to determine a position of the first and second cut layers. For example, in some embodiments, the mask cut placement tool 1512 is configured to determine a location of a first cut within the first plurality of shapes from the first cut layer data 1506, and to determine a location of a second cut within the first second of shapes from the second cut layer data 1508.

A mask writing tool 1514 is configured to access the first cut layer data 1506 and the second cut layer data 1508. Based upon the first cut layer data 1506, the mask writing tool 1514 is configured to generate a first cut mask. Based upon the second cut layer data 1508, the mask writing tool 1514 is configured to generate a second cut mask. The first cut mask is configured to cut the first plurality of shapes and the second cut mask is configured to cut the second plurality of shapes.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the disclosed IC layouts are illustrated as comprising a plurality of design shapes comprising square or rectangles, it will be appreciated that such shapes are not limiting. Rather, the disclosed method and apparatus may be applied to designs having design shapes of any geometry allowed by design rules. Furthermore, the disclosed shapes may be comprised within any MPL design layer, such as for example, metal interconnect layers, polysilicon layers, active layers, etc.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a method of performing a self-aligned litho-etch (SALE) process that provides for comparable end-to-end spaces between shapes formed by different photolithography processes.

In some embodiments, the present disclosure relates to a method of performing a semiconductor fabrication process. The method comprises forming a spacer material having vertically extending segments along sidewalls of a masking layer and a horizontally extending segment connecting the vertically extending segments. A cut material is formed over a part of the horizontally extending segment and the horizontally extending segment of the spacer material not covered by the cut material is removed. A layer under the masking layer is patterned according to the masking layer and the spacer material.

In other embodiments, the present disclosure relates to a method of semiconductor processing. The method comprises forming a spacer material extending between sidewalls of a masking layer, and forming a cut material over a part of the spacer material; The spacer material is etched with the cut material over the spacer material. A layer under the masking layer is patterned according to the masking layer and the spacer material.

In yet other embodiments, the present disclosure relates to a method of semiconductor processing. The method comprises forming a masking structure having sidewalls defining a first plurality of openings separated from sidewalls defining a second plurality of openings along a first direction by a spacer material and a first masking layer. The sidewalls defining the first plurality of openings are separated along a second direction by the spacer material and an overlying cut material. A layer under the masking structure is patterned according to the masking structure.

What is claimed is:

1. A method of performing a semiconductor fabrication process, comprising:
   forming a spacer material over an underlying layer, wherein the spacer material has sidewalls defining a first trench;
   forming a cut material over the spacer material and within the first trench, wherein the cut material separates the first trench into a pair of trench segments having ends separated by the cut material; and
   patterning the underlying layer according to the spacer material and the cut material.

2. The method of claim 1, further comprising:
   etching the spacer material to expose an upper surface of the underlying layer that is between the sidewalls of the spacer material.

3. The method of claim 1, wherein the pair of trench segments are respectively defined by sidewalls of the spacer material and the cut material.

4. The method of claim 1, further comprising:
   forming a masking layer over the underlying layer;
   forming the spacer material over the masking layer and along sidewalls of the masking layer;
   etching the spacer material to expose an upper surface of the masking layer; and
   etching the masking layer to expose the underlying layer.

5. The method of claim 4, wherein etching the masking layer forms a second trench defined by sidewalls of the spacer material.

6. The method of claim 4, wherein etching the masking layer forms a second pair of trench segments having ends separated by the spacer material.

7. The method of claim 4, wherein the masking layer is etched after forming the cut material over the spacer material.

8. A method of performing a semiconductor fabrication process, comprising:
   forming a spacer material over a masking layer, wherein the masking layer comprises a plurality of sidewalls defining trenches extending through the masking layer to an underlying layer;
   forming a cut material over the spacer material;
   etching the spacer material to define a first pair of trenches having ends separated by the cut material; and
   etching the masking layer to define a second pair of trenches having ends separated by the spacer material.

9. The method of claim 8, wherein the ends of the first pair of trenches are separated by a first distance measured along a first direction and the ends of the second pair of trenches are separated by a second distance measured along the first direction.

10. The method of claim 9, wherein the first distance is substantially equal to the second distance.

11. The method of claim 8, wherein the masking layer comprises first sidewalls defining a first trench, second sidewalls defining a second trench, third sidewalls defining a third trench, and fourth sidewalls defining a fourth trench extending between the second trench and the third trench.

12. The method of claim 11, wherein the fourth sidewalls are perpendicular to the third sidewalls, as viewed from a top-view of the masking layer.

13. The method of claim 11, wherein the spacer material has sidewalls disposed within the first trench, the second trench, and the third trench.

14. The method of claim 11, wherein the spacer material has a first minimum thickness within the first trench and a second minimum thickness within the fourth trench, the second minimum thickness larger than the first minimum thickness.

15. The method of claim 11, wherein the cut material is disposed within the first trench.

16. A method of performing a semiconductor fabrication process, comprising:
    forming a masking layer having sidewalls defining a first trench separated from a second trench along a first direction;
    forming a spacer material along the sidewalls of the masking layer;
    forming a cut material within the first trench, wherein the cut material separates a first part of the first trench from a second part of the first trench along a second direction that is perpendicular to the first direction; and
    performing an etching process to etch the spacer material after forming the cut material, wherein the cut material is along sidewalls of the spacer material after the etching process is completed.

17. The method of claim 16, wherein the cut material has a first outermost sidewall facing the first part of the first trench and a second outermost sidewall facing the second part of the first trench.

18. The method of claim 16, wherein the spacer material continuously extends from a first sidewall directly below the cut material to a second sidewall laterally outside of the cut material.

19. The method of claim 16, wherein the etching process etches the spacer material to expose an upper surface of an underlying layer, and wherein the spacer material continuously extends along an unbroken path surrounding an exposed part of the upper surface of the underlying layer after the etching process is completed.

20. The method of claim 16, wherein the spacer material has a first thickness directly below a center of the cut material and a second thickness directly below an outermost sidewall of the cut material, the second thickness greater than the first thickness.

\* \* \* \* \*